United States Patent
Chen et al.

(10) Patent No.: US 7,655,529 B1
(45) Date of Patent: Feb. 2, 2010

(54) INP BASED HETEROJUNCTION BIPOLAR TRANSISTORS WITH EMITTER-UP AND EMITTER-DOWN PROFILES ON A COMMON WAFER

(75) Inventors: Mary Chen, Oak Park, CA (US); Marko Sokolich, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 119 days.

(21) Appl. No.: 11/052,935

(22) Filed: Feb. 7, 2005

Related U.S. Application Data (60) Provisional application No. 60/603,480, filed on Aug. 20, 2004.

(51) Int. Cl.
*H01L 21/331* (2006.01)

(52) U.S. Cl. ............................ 438/312; 257/E21.387

(58) Field of Classification Search ............... 257/197, 257/183, 862, E29.033, E29.091, E21.387; 438/309, 312, 313, 319
See application file for complete search history.

(56) References Cited

U.S. PATENT DOCUMENTS

| | | | | |
|---|---|---|---|---|
| 5,223,449 A | * | 6/1993 | Morris et al. | ................ 438/188 |
| 6,472,288 B2 | | 10/2002 | Freeman et al. | |
| 6,661,037 B2 | | 12/2003 | Pan et al. | |
| 6,936,871 B2 | | 8/2005 | Hase | |
| 2002/0066909 A1 | * | 6/2002 | Tanomura et al. | ............ 257/197 |
| 2002/0153534 A1 | * | 10/2002 | Mochizuki et al. | .......... 257/183 |
| 2004/0036082 A1 | * | 2/2004 | Bahl et al. | .................. 257/197 |
| 2004/0175895 A1 | * | 9/2004 | Behammer | .................. 438/319 |
| 2004/0188711 A1 | * | 9/2004 | Coolbaugh et al. | .......... 257/197 |

FOREIGN PATENT DOCUMENTS

JP        05175438 A        7/1993

OTHER PUBLICATIONS

Bolognesi, C.R., et al., "Non-Blocking Collector InP/GaAs$_{0.51}$Sb$_{0.49}$/InP Double Heterojunction Bipolar Transistors with a Staggered Lineup Base-Collector Junction," *IEEE Electron Device Letters*, vol. 20, No. 4, pp. 155-157 (Apr. 1999).

Freeman, G., et al., "Device Scaling and Application Trends for Over 200GHz SiGe HBTs," *Digest of Papers*, Topical Meetings, pp. 6-9 (Apr. 9-11, 2003).

Kroemer, H., "Heterostructure Bipolar Transistors and Integrated Circuits," *Proceedings of the IEEE*, vol. 70, No. 1, pp. 13-25 (Jan. 1982).

(Continued)

*Primary Examiner*—Lynne A. Gurley
*Assistant Examiner*—Colleen A Matthews
(74) *Attorney, Agent, or Firm*—Ladas & Parry (57) ABSTRACT

A wafer comprising at least one emitter-up Heterojunction Bipolar Transistor (HBT) and at least one emitter-down HBT on a common InP based semiconductor wafer. Isolation and N-type implants into the device layers differentiate an emitter-down HBT from an emitter-up HBT. The method for preparing a device comprises forming identical layers for all HBTs and performing ion implantation to differentiate an emitter-down HBT from an emitter-up HBT.

12 Claims, 14 Drawing Sheets

OTHER PUBLICATIONS

Nadella, R.K., et al., "MeV Energy Ion Implantation and its Device Applications in InP," *International Conference on InP and Related Materials*, pp. 353-356 (1993).

Pearton, S.J., et al., "Implant-Induced High-Resistivity Regions in InP and InGaAs," *J. Appl. Phys.*, vol. 66, No. 2, pp. 656-662 (Jul. 15, 1989).

Sato, H., et al., "High Current Density Emitter-Down InGaAlAs Heterojunction Bipolar Transistors," *IEEE Transactions on Electron Devices*, vol. 36, No. 11, p. 2601 (Nov. 1989).

Shibata, T., et al., "Stencil Mask Ion Implantation Technology," *IEEE Transactions on Semiconductor Manufacturing*, vol. 15, No. 2, pp. 183-188 (May 2002).

Sokolich, M., et al., "InP HBT Integrated Circuit Technology with Selectively Implanted Subcollector and Regrown Device Layers," *GaAsIc Symposium*, pp. 212-222 (2003).

Tseng, H.C., et al., "High-Performance, Graded-Base AlGaAs/InGaAs Collector-Up Heterojunction Bipolar Transitors Using a Novel Selective Area Regrowth Process," *IEEE Electron Device Letters*, vol. 20, No. 6, pp. 271-273 (Jun. 1999).

Yamahata, S., et al., "InP/InGaAs Collector-Up Heterojunction Bipolar Transistors Fabricated Using Fe-Ion-Implantation," *7th IPRM*, pp. 652-655 (1995).

* cited by examiner

FIG. 29 though the present invention is not intended to be limited.

INP BASED HETEROJUNCTION BIPOLAR TRANSISTORS WITH EMITTER-UP AND EMITTER-DOWN PROFILES ON A COMMON WAFER

CROSS REFERENCE TO RELATED APPLICATIONS

U.S. Provisional Application No. 60/603,480, filed Aug. 20, 2004 for "Group III-V Compound Semiconductor Based Heterojunction Bipolar Transistors with Various Collector Profiles on a Common Wafer" by Mary Chen and Marko Sokolich, the disclosure of which is incorporated herein by reference.

STATEMENT REGARDING FEDERALLY SPONSORED RESEARCH OR DEVELOPMENT

The present invention was made with support from the United States Government under Grant number F33615-02-C-1286 awarded by DARPA. The United States Government has certain rights in the invention.

FIELD

This invention relates to a new design with InP based Heterojunction Bipolar Transistors (HBTs) with emitter-down profiles, including those for high Ft HBTs, and emitter-up profiles, including those for high breakdown voltage (BVceo), on a common wafer and to a method of producing the same.

BACKGROUND AND PRIOR ART

InP based HBT Integrated Circuit (IC) technologies have demonstrated great potential in high-speed digital and mixed-signal applications because of superior speed and bandwidth properties over the SiGe based HBT technology. Although C. R. Bolognesi et al, "Non-blocking collector InP/GaAs$_{0.51}$Sb$_{0.49}$/InP double heterojunction bipolar transistor with a staggered lined up base-collector junction", IEEE Electron Device Letters, Vol., 20, No. 4, April, 1999, pp. 155-157 suggests that a symmetry of InP/GaAsSb/InP DHBT band structure may have the potential for integration of collector-up and emitter-up devices, present invention implements selective ion implantation technology for integration of high Ft HBT (collector-up HBTs) and high BVceo HBT (emitter-up HBTs) on same chip.

SiGe based HBT technology of various collector concentrations available on the same chip has been described in the prior art. See, for example, G. Freeman et al, "Device scaling and application trends for over 200 GHz SiGe HBTs", 2003 Topical Meetings on Silicon Monolithic Integrated Circuits in RF Systems, pp. 6-9, Digest of papers. The SiGe based HBT technology enables high $F_t$ to be traded for high BVceo on the same chip. However, IC designers up to now could not trade high $F_t$ for high BVceo or vice versa on the same InP.

The ability to provide high $F_t$ HBTs and high BVceo HBTs on the same chip is particularly useful in smart Power Amplifiers (PAs) in millimeter wave image radar. Increased power provides longer distance of operation. Smart PAs with digital electronics to control the PAs can be realized by high speed signal processes for regular logic and high BVceo (breakdown voltage) for large swing at output stage. However, presently, when high BVceo HBTs are used in logic circuits lower speed may occur as compensation due to inability to serve as high $F_t$ HBTs in logic circuits on the same chip.

The ability to provide high $F_t$ HBTs and high BVceo HBTs on a common chip substrate may also be useful in the front-end stage of an analog to digital (A/D) converter. Having high $F_t$ HBTs and high BVceo HBTs on common chip substrate may provide increased dynamic range and larger input to analog converter which may be advantageous for higher signal/noise (S/N) ratio and resolution. However, A/D technologies of today cannot provide significantly higher peak-to-peak input signal than 1V with good linearity. Better dynamic range may improve this technology.

Accordingly there is a need for fabricating and integrating high $F_t$ HBTs and high BVceo HBTs on the common non-silicon based wafer.

DETAILED DESCRIPTION

In the following description, like reference numbers are used to identify like elements. Furthermore, the drawings are intended to illustrate major features of exemplary embodiments in a diagrammatic manner. The drawings are not intended to depict every feature of every implementation nor relative dimensions of the depicted elements, and are not drawn to scale.

The present disclosure describes new designs with InP based HBTs with emitter-up (collector-down) and emitter-down (collector-up) profiles including those for high $F_t$ HBTs and high BVceo HBTs on a common wafer. Specially designed epi-taxial layer structures with selective area doping by ion implantation can integrate HBTs with emitter-up and emitter-down profiles, including those HBTs for high $F_t$ and HBTs for high BVceo on the same InP wafer without backside processing.

Figure 1:
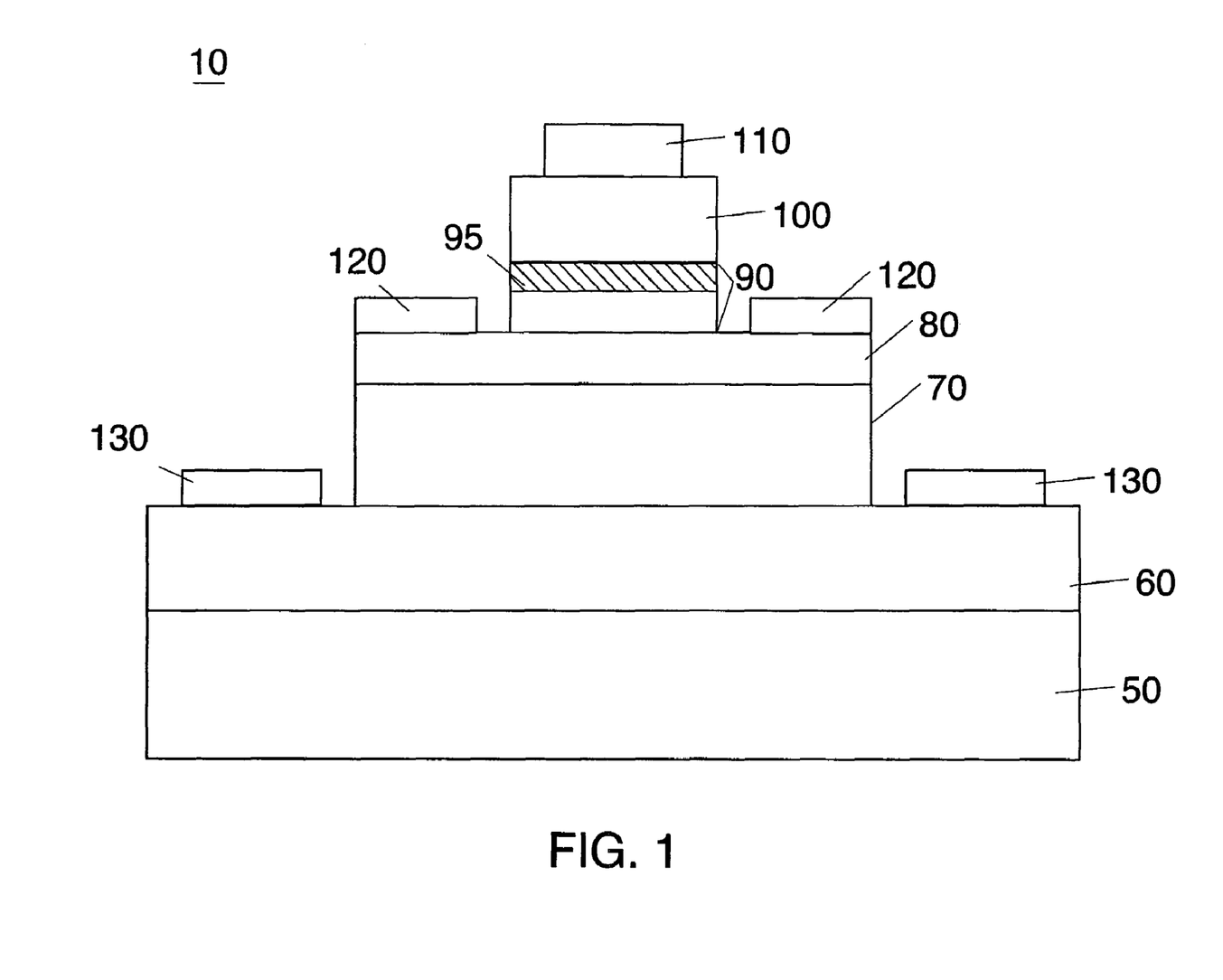
FIG. 1 depicts a side view of an emitter-up HBT.
Figure 2:
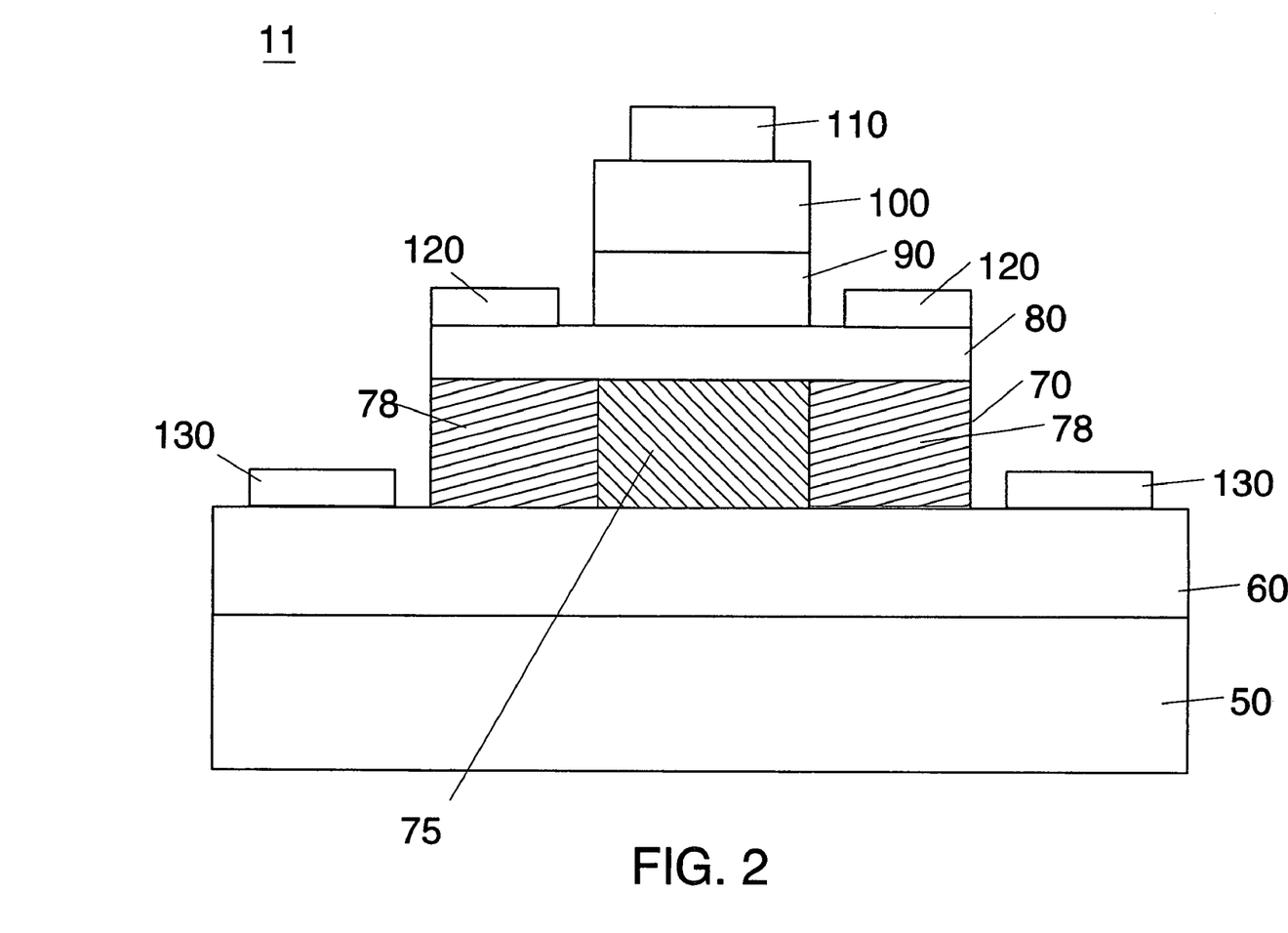
FIG. 2 depicts a side view of an emitter-down HBT.
Figure 3:
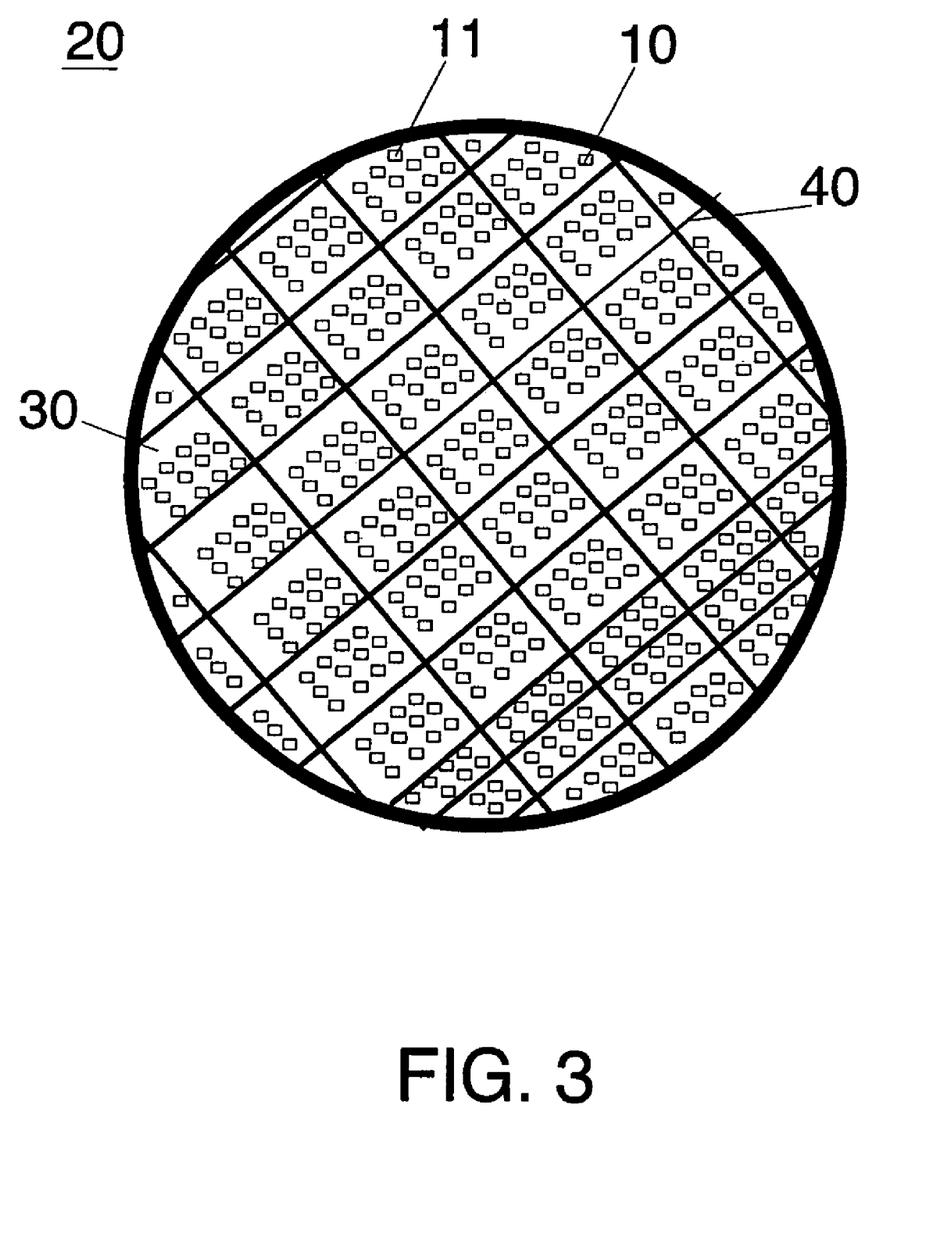
FIG. 3 depicts a wafer with HBTs on the wafer.

Referring to FIGS. 1 and 2, in one exemplary embodiment, a cutaway side view is shown of two out of hundreds of thousands (for example) of HBTs 10 and 11 of the presently disclosed technology that may be grown as part of individual circuits 30 separated by streets 40 on a substrate of wafer 20 (See FIG. 3). For clarity reasons the HBTs 10 and 11, individual circuits 30 and wafer 20, as depicted in FIGS. 1, 2 and 3, are not to scale.

According to the presently disclosed technology, HBTs, as shown in FIGS. 1 and 2, may be grown having either a high BVceo or a high $F_t$ by performing ion implantation in layer 90 or layer 70, as shown in FIGS. 1 and 2.

Referring to FIGS. 1-19, individual HBTs 10 and 11 may be grown on the substrate 50 of the wafer 20, wherein the substrate layer 50 may be a Semi-Insulating (S.I.) InP wafer. The thickness of the substrate layer 50 may be about 0.5 mm. For clarity and example purposes FIGS. 3-19 depict the process of forming at least one emitter-up HBT 10 and at least one emitter-down HBT 11 on the single wafer 20, as shown in FIG. 3.

Figure 4:
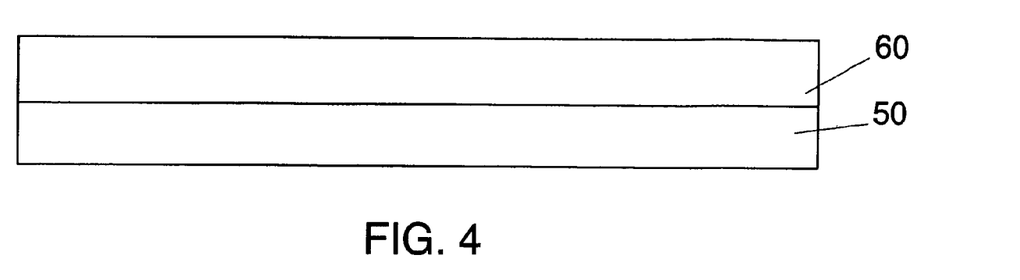
FIGS. 4-23 depict a process of forming HBTs based on an exemplary embodiment.

Referring to FIG. 4, layer 60 may be formed, for example by epitaxial growth, on top of the substrate 50. The layer 60 may comprise, for example, N-type InGaAs (N+) material that is heavily doped with silicon or N-type InP (N+) material that is heavily doped with silicon. The thickness of the layer 60 can vary from about 100 Å to about 5000 Å. Layer 60 may function as a sub-collector layer for emitter-up HBT 10 or as a sub-emitter layer for emitter-down HBT 11.

Figure 5:
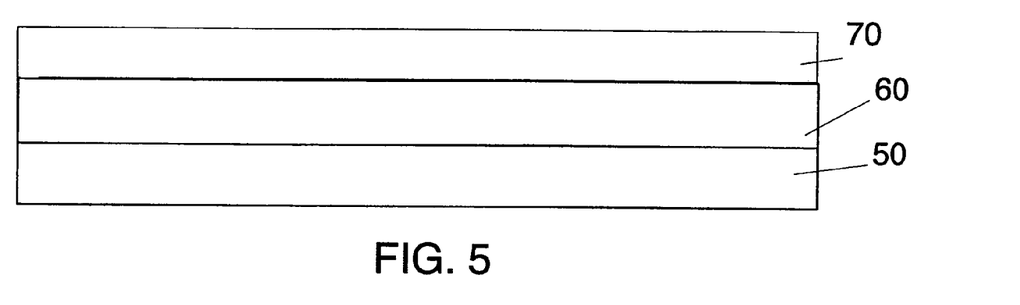

Referring to FIG. 5, layer 70 may be formed, for example, by epitaxial growth, on top of the layer 60. The layer 70 may comprise, for example, N-type InP (N−) undoped material. The thickness of the layer 70 may be determined by the emitter-up HBTs in the wafer 20 with the highest BVceo requirement. Layer 70 may be formed uniformly across layer 60 to a maximum thickness that is required to yield the emitter-up HBT with the highest BVceo requirement. The profile of the layer 70 for emitter-up HBTs may be varied as described in the U.S. Provisional Application No. 60/603, 480, incorporated herein by reference. Layer 70 may function as a collector layer for emitter-up HBT 10 or as an emitter layer for emitter-down HBT 11.

Figure 6:
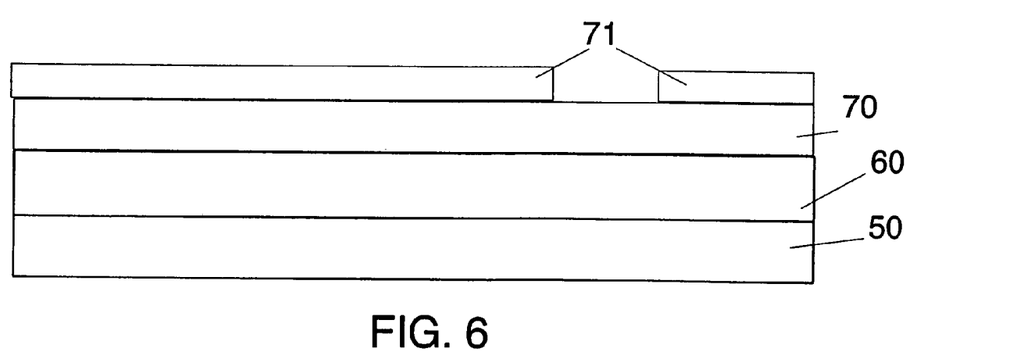
Figure 7:
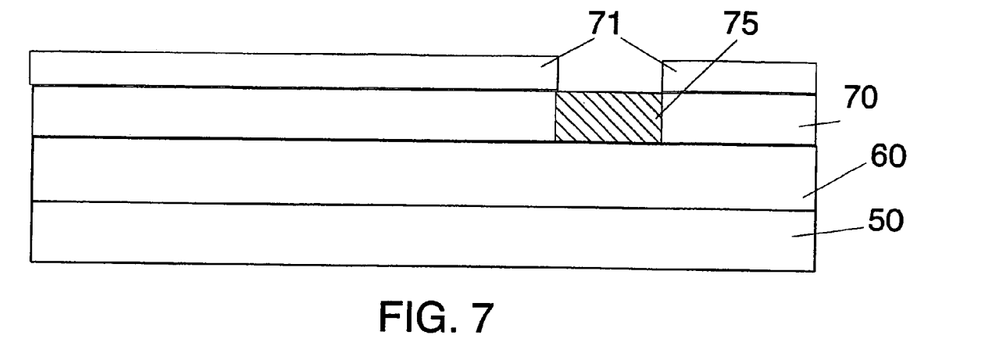
Figure 8:
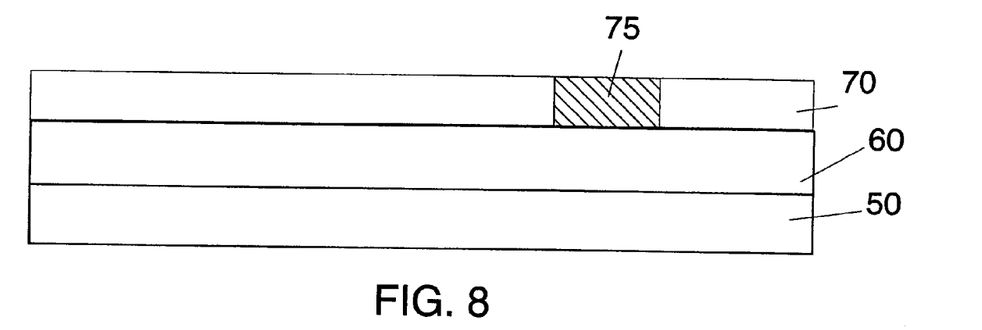

Referring to FIGS. 2 and 6-11, to form an emitter layer for emitter-down HBT 11, an ion implantation may be performed on layer 70 to create N-type doped (N) regions 75 and isolated regions 78. Isolation regions 78 may prevent parasitic current injection through the extrinsic base-emitter junction area under forward bias. The ion implantation of region 75 in the individual emitter-down HBTs 11 may be performed by: 1) applying and forming an implant mask 71 on top of the layer 70 so as to expose only the portion of the layer 70 for one or more of the emitter-down HBTs, as shown in FIG. 6; 2) performing ion implantation until region 75 is formed, as shown in FIG. 7; 3) removing implant mask 71 and annealing the structure in FIG. 8 for implant activation and damage removal wherein N region 75 is formed.

This disclosure is not limited to a shape of implant region 75 as depicted in FIGS. 2 and 6-8. There may be single or multiple implants forming individual region 75 depending on the performance requirements for the emitter-down HBTs 11. The thickness and doping level of region 75 may be formed by varying the energy and dose of the ion implantation process.

Figure 9:
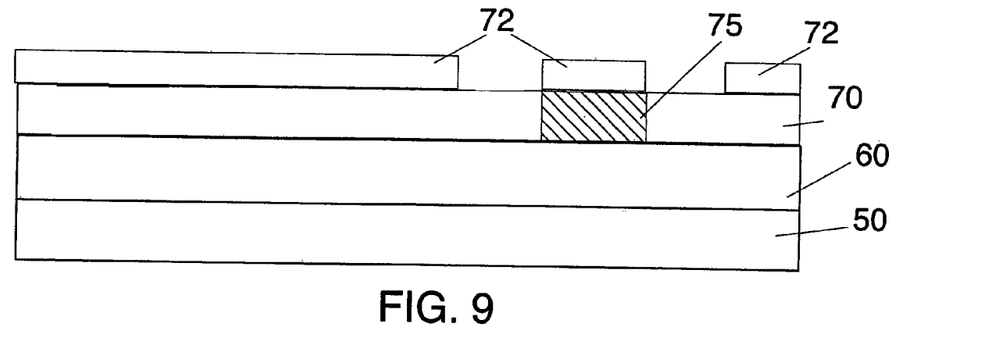
Figure 10:
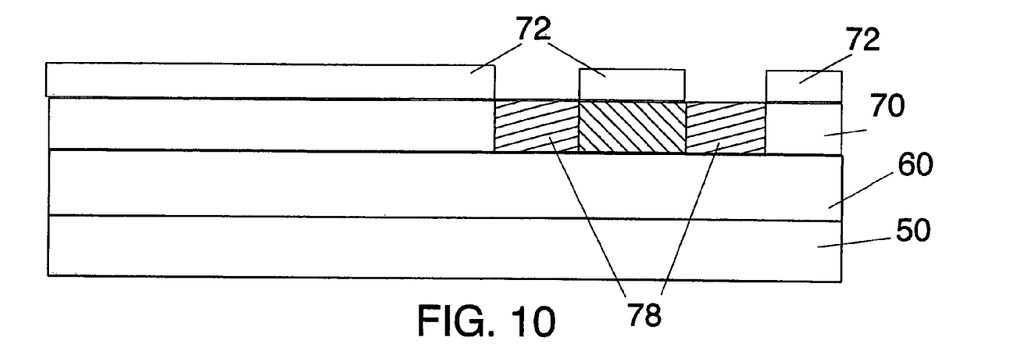
Figure 11:
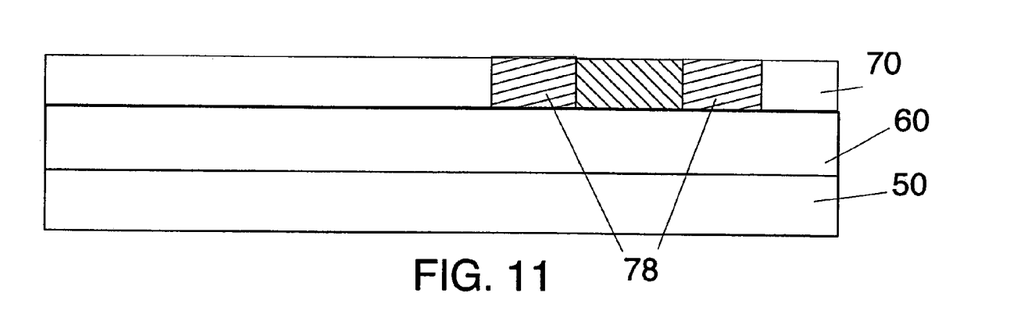

Referring to FIGS. 2 and 9-11, the ion implantation of regions 78 for isolation in the individual emitter-down HBTs 11 may be performed by: 1) applying and forming an implant mask 72 on top of the layer 70 so as to expose only the portions of the layer 70 for one or more of the emitter-down HBTs, as shown in FIG. 9; 2) performing ion implantation until regions 78 are formed, as shown in FIG. 10; 3) removing implant mask 72, as shown in FIG. 11. This disclosure is not limited to shape of implant isolation regions 78 as depicted in FIGS. 2 and 9-11.

The ion implantation of regions 75 may follow ion implantation of regions 78. If regions 78 are implanted before regions 75, regions 75 may be subjected to rapid thermal annealing to avoid possible thermal instability in regions 78.

The ion implantation of regions 75 and 78 may be performed by regular masked implantation or by stencil mask ion implantation technology. See for example Takeshi Shibata et al, "Stencil mask ion implantation technology", IEEE Transactions on semiconductor manufacturing, Vol, 15, No. 2, May 2002, pp. 183-188.

Upon completion of the ion implantation, an optional smoothing layer (not shown) may be formed by epitaxial growth on top of the layer 70. The smoothing layer may enable smoothing of the epitaxial growth surface prior to deposition of the base-collector interface and emitter-base interface. The smoothing layer may comprise, for example, N-type InP (N−) material. The thickness of the smoothing layer may, for example, be about 200 Å.

Figure 12:
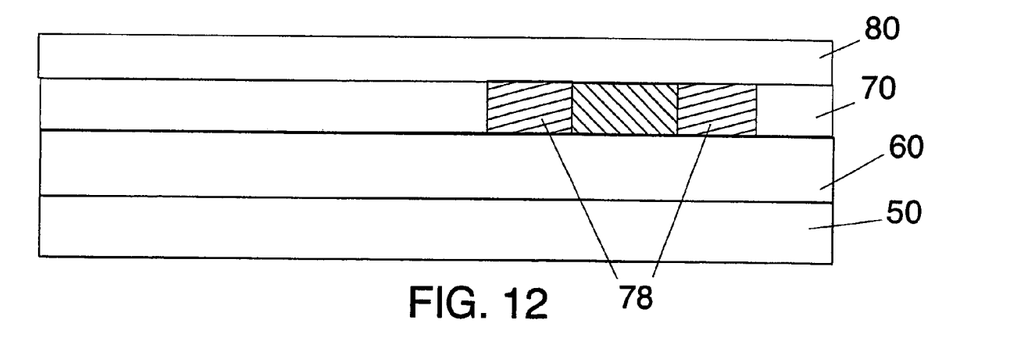

Referring to FIG. 12, a base layer 80 may be formed, for example, by epitaxial growth, on top of the layer 70 or on top of the optional layer referred to above. The base layer 80 may comprise, for example, P-type GaAsSb (P+) material. The thickness of the base layer 80 may, for example, be about 400 Å.

Figure 13:
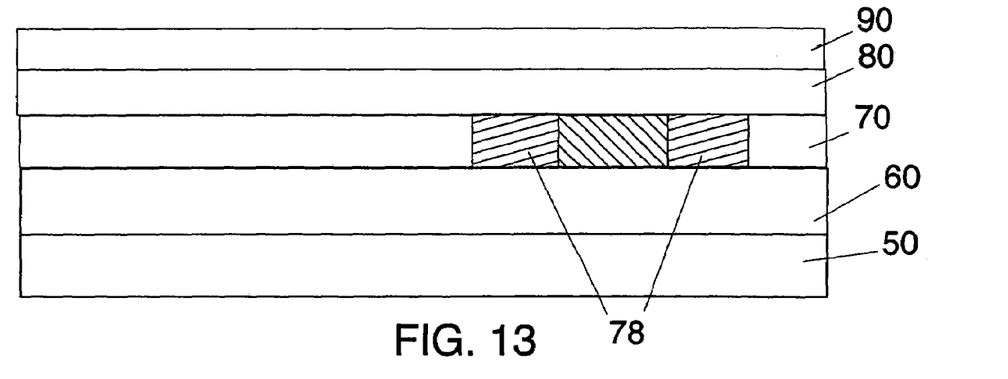

Referring to FIG. 13, a layer 90 may be formed, for example by epitaxial growth, on top of the base layer 80. The layer 90 may comprise, for example, N-type InP (N) material doped with silicon. The thickness of the layer 90 may, for example, be about 1500 Å. Layer 90 may function as an emitter layer for emitter-up HBT 10 or as a collector layer for emitter-down HBT 11.

Figure 14:
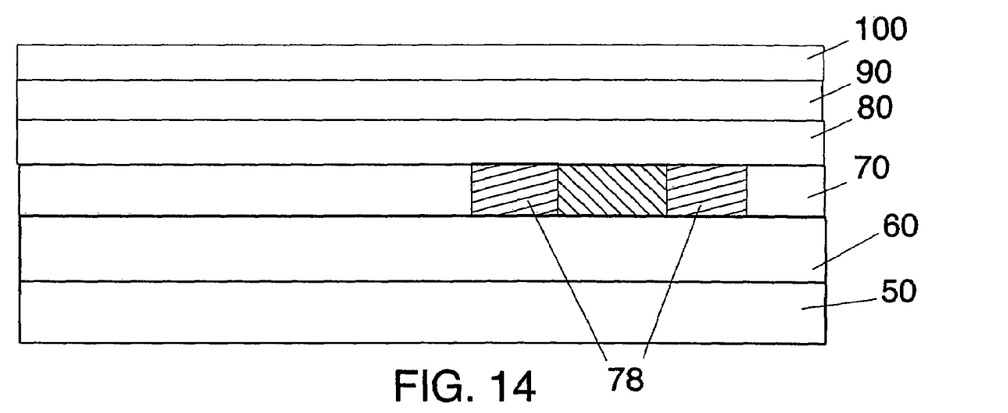

Referring to FIG. 14, a layer 100 may be formed, for example by epitaxial growth. The emitter cap layer 9 may comprise, for example, N-type InGaAs (N+) material that is doped heavily with silicon. The thickness of the layer 100 may, for example, be about 1000 Å. Layer 100 may function as a collector cap for emitter-down HBT 11 or as an emitter cap for emitter-up HBT 10.

Referring to FIG. 1, an optional implantation of region 95 may be performed to increase doping of the emitter layer (layer 90) and lower emitter resistance Re for emitter-up HBTs 10.

Figure 15:
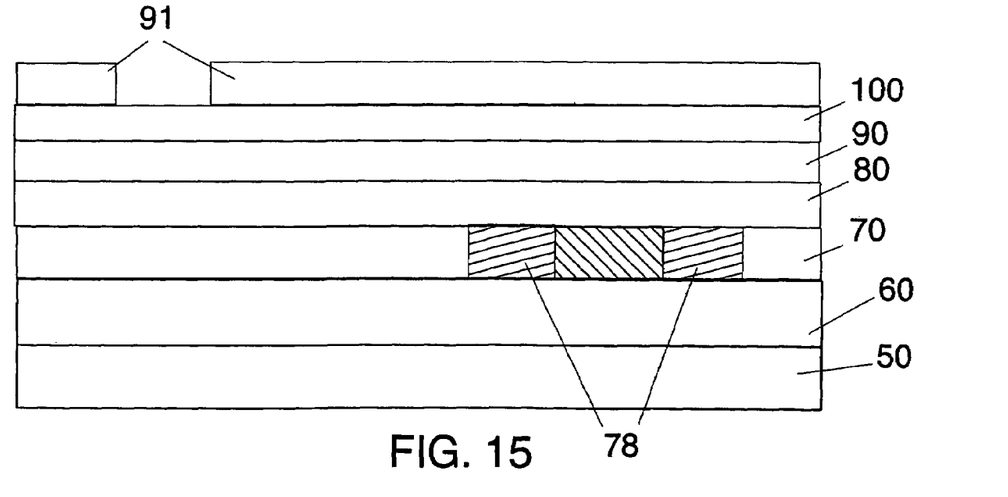
Figure 16:
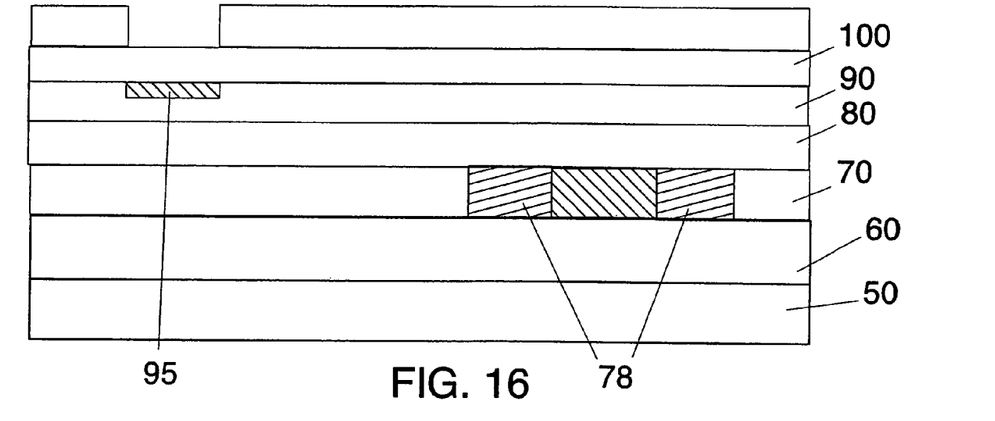
Figure 17:
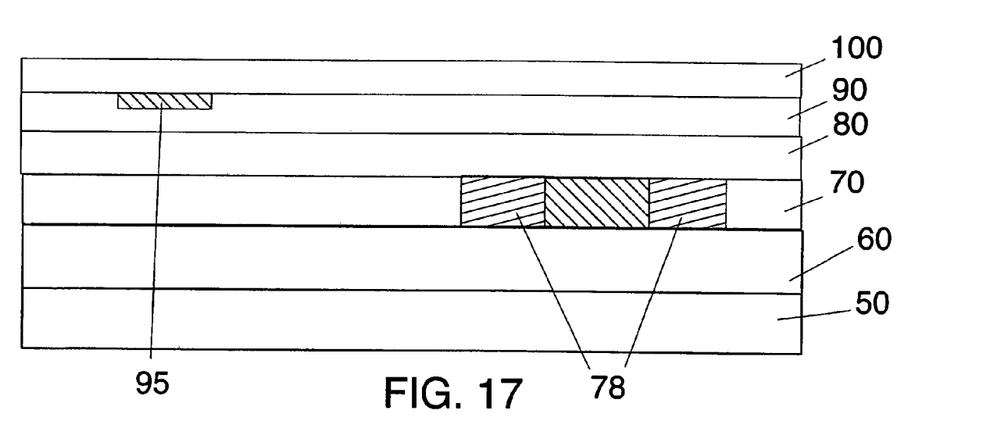

Referring to FIGS. 1 and 15-17, to form an emitter layer for emitter-up HBT 10, an ion implantation may be performed on layer 90 to create a heavily doped (N+) region 95. The ion implantation of region 95 in the individual emitter-up HBTs 10 may be performed by: 1) applying and forming an implant mask 91 on top of the layer 100 so as to expose only the portions of the layers 90 and 100 for one or more of the emitter-up HBTs, as shown in FIG. 15; 2) performing ion implantation until region 95 may be formed, as shown in FIG. 16; 3) removing implant mask 91 and performing rapid thermal annealing of the structure in FIG. 17 for implant activation and damage removal wherein N+ region 95 may be formed.

Ion implantation of region 95 may be performed on layer 90 prior to formation of layer 100.

This disclosure is not limited to a shape of implant region 95 as depicted in FIGS. 1 and 15-17. There may be single or multiple implants forming individual region 95 depending on the performance requirement for emitter-up HBTs 10. The thickness and doping level of region 95 may be formed by varying the energy and dose of the ion implantation process.

Figure 18:
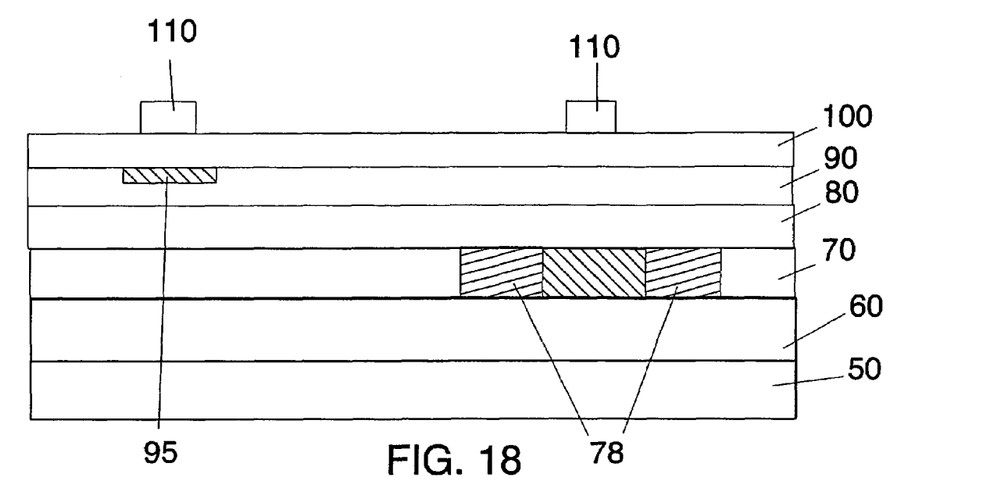
Figure 19:
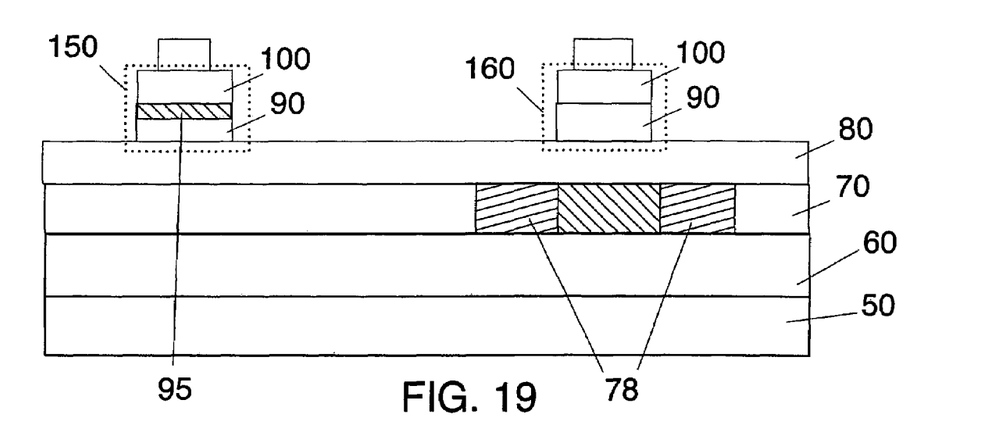
Figure 20:
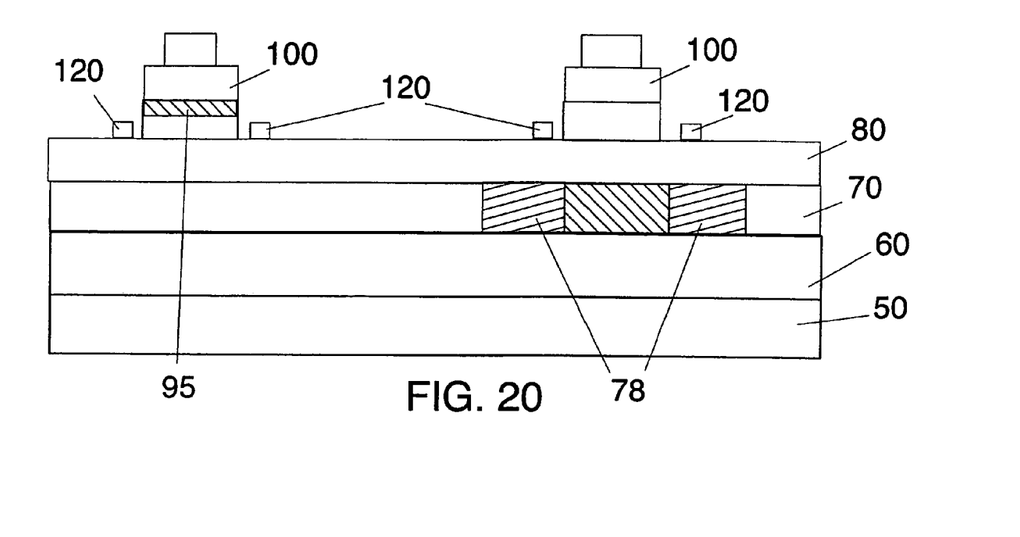
Figure 21:
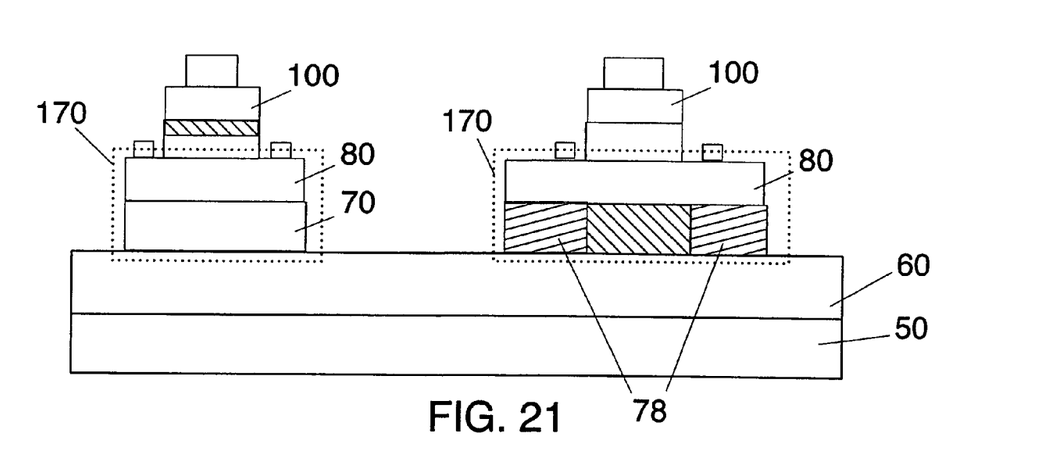
Figure 22:
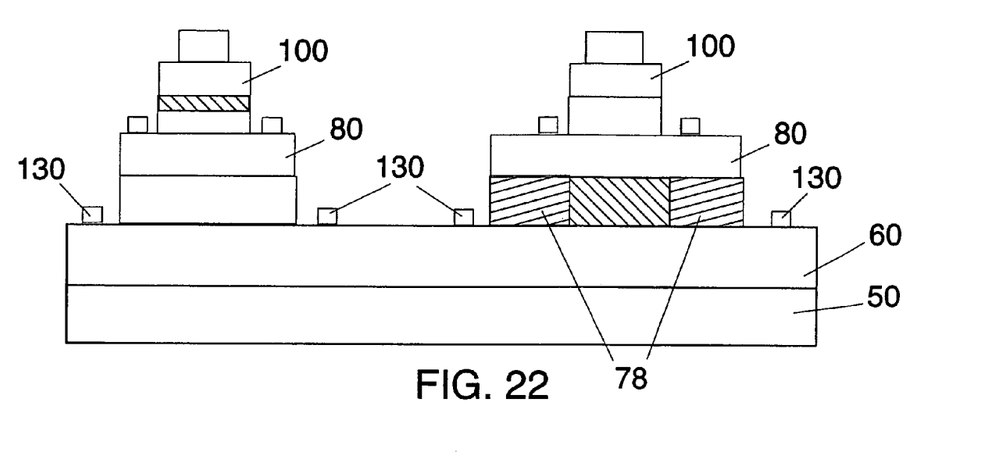
Figure 23:
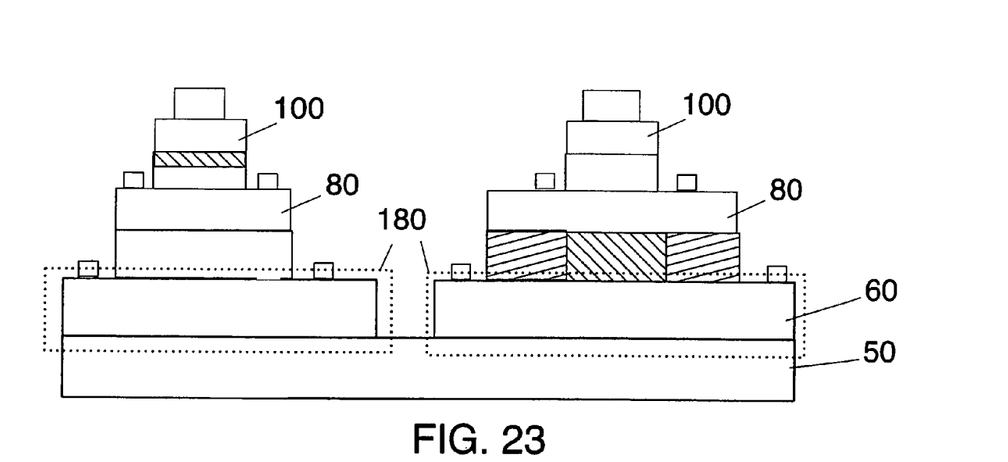

In one exemplary embodiment, the process of HBT fabrication may include: providing metal contacts 110 through lithography and metal deposition as shown in FIG. 18; etching emitter mesas 150 for emitter-up HBT 10 and collector mesas 160 for emitter-down HBT 11, as shown in FIG. 19; providing base metal contacts 120 through lithography and metal deposition, as shown in FIG. 20; etching base mesas 170, as shown in FIG. 21; providing metal contacts 130 through lithography and metal deposition, as shown in FIG. 22; and etching isolation mesas 180, as shown in FIG. 23. As shown in FIGS. 18-23, the substrate 50 has the same thickness at locations under the emitter-up HBT 10 and the emitter-down HBT 11. The substrate 50 may also have the same thickness at locations between the emitter-up HBT 10 and the emitter-down HBT 11.

Metal contacts 110 may function as emitter contacts for emitter-up HBTs 10 or as a collector contact for emitter-down HBTs 11. Metal contacts 130 may function as collector contacts for emitter-up HBTs 10 or as emitter contacts for emitter-down HBTs 11. The electrically conducting metal contacts 110, 120, 130 may comprise, for example, Ti/Pt/Au, Pt/Ti/Pt/Au, AuGe or AuGe/Ni/Au.

Figure 24:
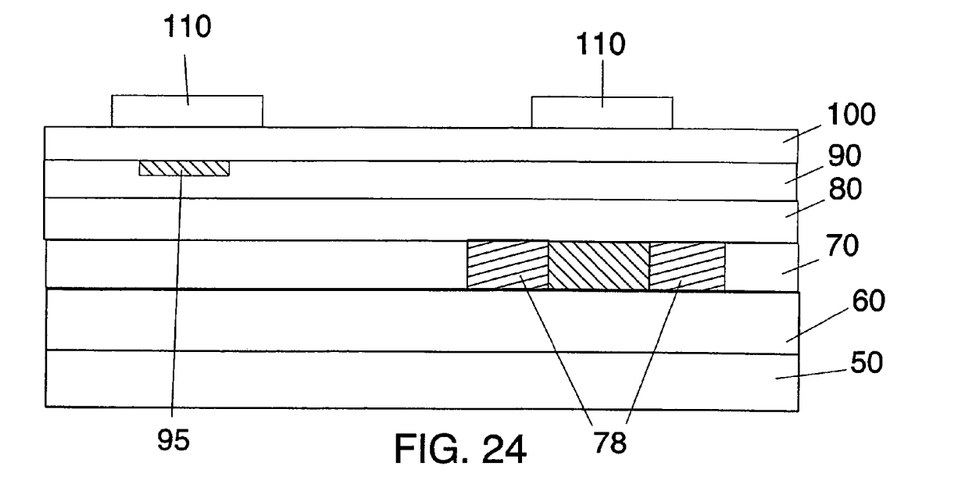
FIGS. 24-29 depict a process of forming HBTs based on another exemplary embodiment.
Figure 25:
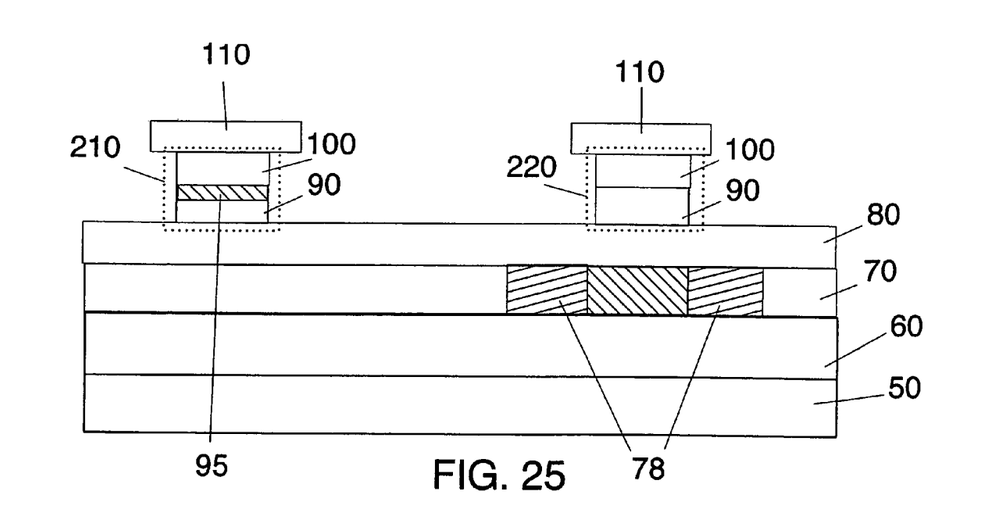

Referring to FIGS. 24-29, in another exemplary embodiment, the process of HBT fabrication may include formation of self-aligned base metal contacts 120 so as to lower base resistance. Referring to FIG. 24, formation of self-aligned metal contacts 120 may include providing metal contacts 110 through lithography and metal deposition. Referring to FIG. 25, emitter mesas 210 for emitter-up HBT 10 and collector mesas 220 for emitter-down HBT 11 may be etched. Using metal contacts 110 as a mask, etching of mesas 210 and 220 may be performed. Due to over etching, lateral overhang of the metal contacts 110 may be expected.

Figure 26:
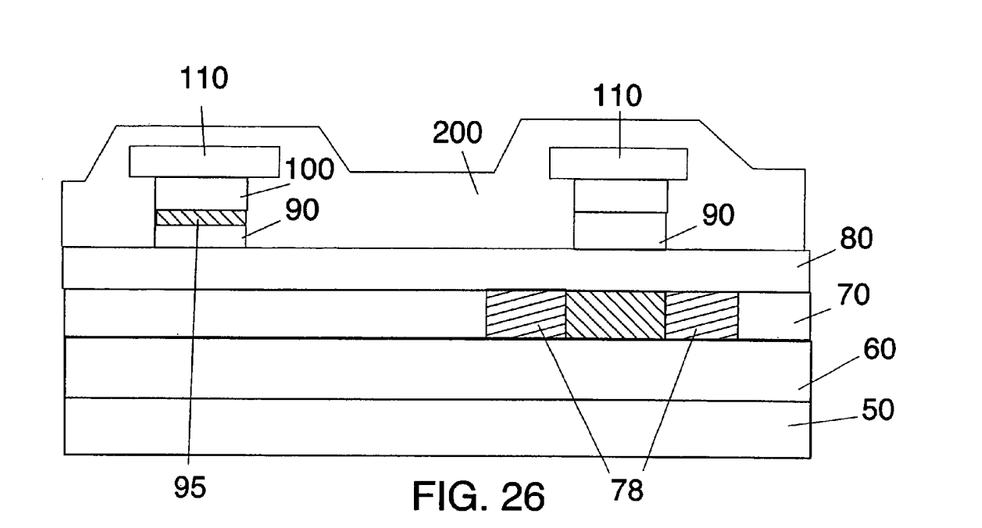

Referring to FIG. 26, layer 200 may be formed to at least partially cover metal contacts 110. Layer 200 may comprise, for example, positive tone photo definable polyimide (PDPI) or positive tone photo sensitive interlayer dielectric (ILD).

Figure 27:
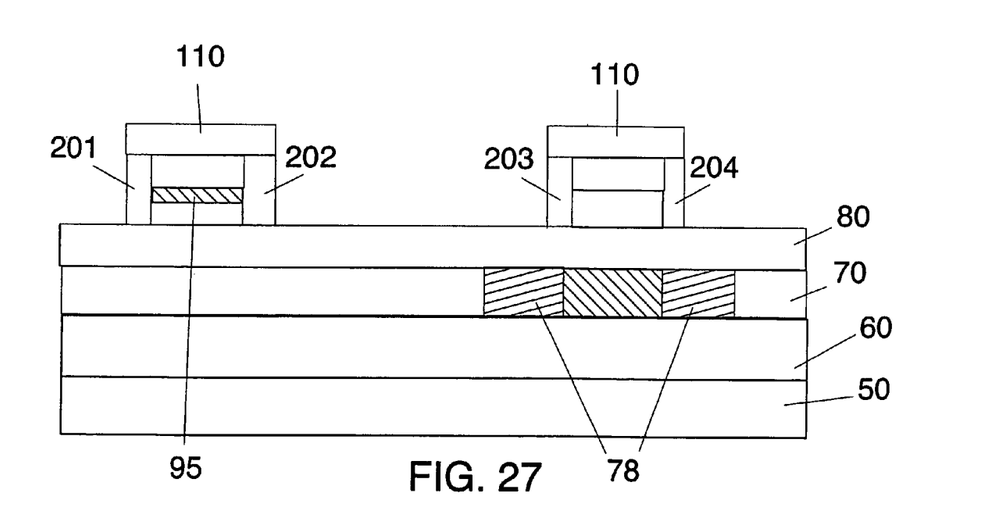

Referring to FIG. 27, layer 200 may be soft baked, may be flood exposed (maskless) and may be developed so as to remove most of the exposed layer 200 material except for the portions 201, 202, 203 and 204 protected by the lateral overhang of the metal contacts 110. Flooding of the layer 200 may be performed with g-line (436 nm) or l-line (365 nm) lithography tools. Portions 201, 202, 203 and 204 may further be cured so as to avoid damage from sequential solvents or other processes.

Figure 28:
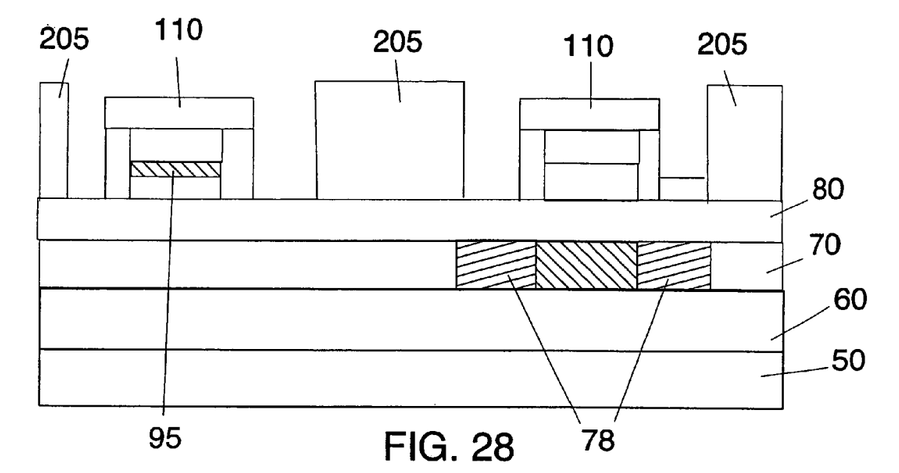
Figure 29:
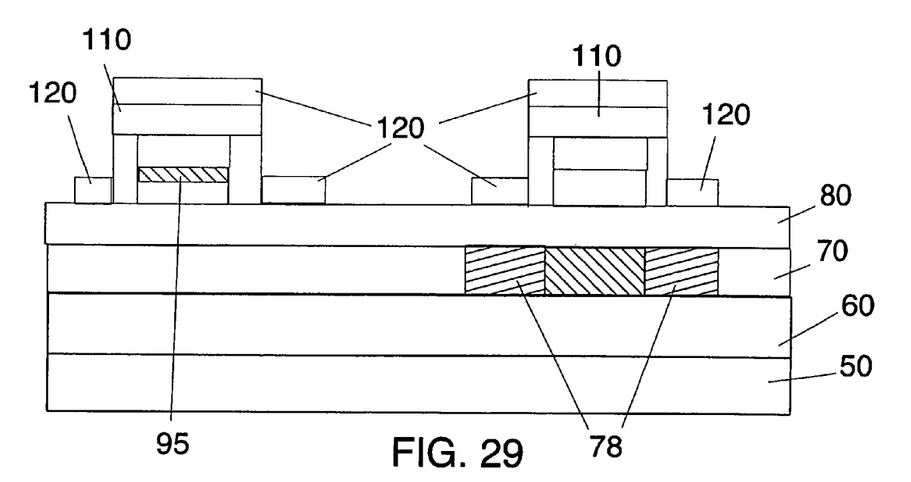

Referring to FIGS. 28-29, formation of self-aligned metal contacts 120 may be performed by: providing a photoresist layer 205 (patterned for base contact metal) so as to expose portions of layer 80, as shown in FIG. 28; depositing metal contacts 120 and removing photoresist layer 205 through lift off process, as shown in FIG. 29; removing any metal flaxes that may be deposited on portions 201, 202, 203, 204 by performing slight Argon (Ar) ion milling etch process.

The process of HBT fabrication may further include: etching base mesas (not shown); providing metal contacts 130 through lithography and metal deposition; and etching isolation mesas (not shown).

The foregoing Detailed Description of exemplary and preferred embodiments is presented for purposes of illustration and disclosure in accordance with the requirements of the law. It is not intended to be exhaustive nor to limit the invention to the precise form(s) described, but only to enable others skilled in the art to understand how the invention may be suited for a particular use or implementation. The possibility of modifications and variations will be apparent to practitioners skilled in the art. No limitation is intended by the description of exemplary embodiments which may have included tolerances, feature dimensions, specific operating conditions, engineering specifications, or the like, and which may vary between implementations or with changes to the state of the art, and no limitation should be implied therefrom. Applicant has made this disclosure with respect to the current state of the art, but also contemplates advancements and that adaptations in the future may take into consideration those advancements, namely in accordance with the then current state of the art. It is intended that the scope of the invention be defined by the claims as written and equivalents as applicable. Reference to a claim element in the singular is not intended to mean "one and only one" unless explicitly so stated. Moreover, no element, component, nor method or process step in this disclosure is intended to be dedicated to the public regardless of whether the element, component, or step is explicitly recited in the claims. No claim element herein is to be construed under the provisions of 35 U.S.C. Sec. 112, sixth paragraph, unless the element is expressly recited using the phrase "means for . . . " and no method or process step herein is to be construed under those provisions unless the step, or steps, are expressly recited using the phrase "comprising the step(s) of . . . ."

What is claimed is:

1. A method of integrating emitter-up and emitter-down Hetero-junction Bipolar Transistors (HBTs) comprising:
   forming an emitter-up HBT on a first location on a substrate; and
   forming an emitter-down HBT on a second location on the substrate, wherein the substrate is of equal thickness at the first location and the second location;
   wherein forming the emitter-up HBT comprises:
      forming an undoped collector layer over the substrate;
      forming a base layer over the undoped collector layer; and
      forming an emitter layer over the base layer; and
   wherein forming the emitter-down HBT comprises:
      implanting a first ion implant in the undoped collector layer to form an emitter;
      implanting a second ion implant in the undoped collector layer adjacent to the first ion implant for preventing parasitic current injection through an extrinsic base emitter junction area under forward bias;
      forming the base layer over the first and second ion implants; and
      forming the emitter layer over the base layer to provide a collector for the emitter-down HBT.

2. The method of claim 1 wherein implanting the first ion implant further comprises:
   applying a first implant mask on top of the undoped collector layer so as to expose a portion of the undoped collector layer for the emitter-down HBT;
   implanting ions through the exposed portion;
   removing the first implant mask; and
   performing annealing for implant activation and damage removal.

3. The method of claim 2 wherein implanting the second ion implant further comprises:
   applying a second implant mask on top of the undoped collector layer so as to expose the undoped collector layer adjacent to the first ion implant;
   implanting ions through the exposed portion; and
   removing the second implant mask.

4. The method of claim 1 wherein the substrate comprises a semi-insulating InP wafer.

5. The method of claim 1 wherein the undoped collector layer comprises N-type InP (N$^-$) undoped material.

6. The method of claim 1 further comprising forming the undoped collector layer to have a thickness to obtain a BVceo for the emitter-up HBT.

7. The method of claim 1 wherein the base layer comprises P-type GaAsSb (P+) material.

8. The method of claim 1 wherein the emitter layer comprises N-type InP (N) material.

9. The method of claim 1 wherein forming the emitter-up HBT further comprises implanting a third ion implant in the emitter layer.

10. The method of claim 1 wherein:
   forming the emitter-up HBT further comprises:
      etching an emitter mesa;
      etching a first base mesa; and
      etching a first isolation mesa; and
   forming the emitter-down HBT further comprises:
      etching a collector mesa;
      etching a second base mesa; and
      etching a second isolation mesa.

11. The method of claim 1 wherein:
   forming the emitter-up HBT further comprises:
      forming an emitter metal contact;

using the emitter metal contact as a mask to etch an emitter mesa;
etching the emitter mesa so that the emitter metal contact has an overhang over the emitter mesa;
forming a photo sensitive dielectric layer to a least partially cover the emitter metal contact;
exposing the photo sensitive dielectric layer;
developing said photo sensitive dielectric layer to remove most of the photo sensitive layer, wherein portions of the photo sensitive dielectric layer remain under the overhang of the emitter metal contact; and
using the remaining portions of the photo sensitive dielectric layer to form a self aligned base metal contact.

12. The method of claim 1 wherein:
the substrate comprises a semi-insulating InP wafer;
the undoped collector layer comprises N-type InP (N$^-$) undoped material;
the base layer comprises P-type GaAsSb (P+) material; and
the emitter layer comprises N-type InP (N) material.

* * * * *